(12) United States Patent
Park et al.

(10) Patent No.: US 12,210,263 B2
(45) Date of Patent: Jan. 28, 2025

(54) OPTICAL PATH CONTROL MEMBER AND DISPLAY DEVICE COMPRISING SAME

(71) Applicant: LG INNOTEK CO., LTD., Seoul (KR)

(72) Inventors: Jin Gyeong Park, Seoul (KR); Jong Sik Lee, Seoul (KR); Byung Sook Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/003,613

(22) PCT Filed: Jun. 28, 2021

(86) PCT No.: PCT/KR2021/008055
§ 371 (c)(1),
(2) Date: Dec. 28, 2022

(87) PCT Pub. No.: WO2022/005123
PCT Pub. Date: Jan. 6, 2022

(65) Prior Publication Data
US 2023/0236467 A1     Jul. 27, 2023

(30) Foreign Application Priority Data
Jun. 30, 2020   (KR) .................. 10-2020-0080143

(51) Int. Cl.
*G02F 1/1675*     (2019.01)
*G02F 1/13357*    (2006.01)
(Continued)

(52) U.S. Cl.
CPC .......... *G02F 1/1675* (2019.01); *G02F 1/1336* (2013.01); *G02F 1/167* (2013.01); *H10K 59/8791* (2023.02); *H10K 2102/3023* (2023.02)

(58) Field of Classification Search
CPC ...... G02F 1/1675; G02F 1/1336; G02F 1/167; G02F 1/1677; G02F 1/1681;
(Continued)

(56) References Cited

U.S. PATENT DOCUMENTS 7,729,040 B2     6/2010  Uchida
8,031,319 B1 *  10/2011  Benoit .................. G02F 1/1341
                                                          349/154
(Continued)

FOREIGN PATENT DOCUMENTS

JP    2009-222902 A    10/2009
JP     2010-85566 A     4/2010
(Continued)

OTHER PUBLICATIONS

International Search Report dated Oct. 12, 2021 in International Application No. PCT/KR2021/008055.
(Continued)

*Primary Examiner* — Nitin Patel
*Assistant Examiner* — Amen W Bogale
(74) *Attorney, Agent, or Firm* — SALIWANCHIK, LLOYD & EISENSCHENK

(57) ABSTRACT

An optical path control member according to an embodiment comprises: a first substrate; a first electrode disposed on the first substrate; a second substrate disposed on the first substrate; a second electrode disposed below the second substrate; and a light conversion unit disposed between the first electrode and the second electrode, wherein the second substrate and the second electrode comprise at least one hole penetrating the second substrate and the second electrode, and a sealing part is disposed inside the hole.

20 Claims, 12 Drawing Sheets

(51) Int. Cl.
*G02F 1/167* (2019.01)
*H10K 59/80* (2023.01)
*H10K 102/00* (2023.01)

(58) Field of Classification Search
CPC ...... G02F 1/133524; G02F 2001/1678; H10K 59/8791; H10K 2102/3023; H10K 59/50; H10K 50/86
See application file for complete search history.

(56) References Cited

U.S. PATENT DOCUMENTS

| | | | |
|---|---|---|---|
| 10,509,273 B2 | 12/2019 | You et al. | |
| 2002/0171620 A1 | 11/2002 | Gordon, II et al. | |
| 2008/0123178 A1* | 5/2008 | Uchida | G02F 1/167 445/24 |
| 2008/0198443 A1* | 8/2008 | Yoshimura | G02F 1/167 264/238 |
| 2009/0231676 A1 | 9/2009 | Uchida | |
| 2011/0090162 A1* | 4/2011 | Shih | G02F 1/167 345/173 |
| 2012/0092754 A1* | 4/2012 | Yu | G02F 1/167 156/146 |
| 2013/0248086 A1* | 9/2013 | Hamada | G02F 1/1339 156/145 |
| 2016/0291218 A1* | 10/2016 | Asaoka | G02B 5/0268 |
| 2016/0370642 A1* | 12/2016 | Yoon | G02F 1/1679 |
| 2017/0010516 A1 | 1/2017 | Shiota | |
| 2017/0097537 A1* | 4/2017 | Park | H10K 59/50 |
| 2018/0074377 A1 | 3/2018 | You et al. | |
| 2018/0149942 A1* | 5/2018 | Harris | G02F 1/1345 |
| 2019/0072822 A1* | 3/2019 | Yasunaga | G02F 1/133524 |
| 2019/0250482 A1 | 8/2019 | Shiota et al. | |
| 2020/0050033 A1 | 2/2020 | Galwaduge et al. | |
| 2021/0201836 A1* | 7/2021 | Nakanishi | G09G 3/3648 |
| 2021/0373403 A1 | 12/2021 | Kim et al. | |
| 2022/0026775 A1* | 1/2022 | Kayal | G02F 1/1676 |
| 2022/0206209 A1* | 6/2022 | Lee | G02F 1/133603 |
| 2023/0047411 A1* | 2/2023 | Kawada | G02B 19/0019 |

FOREIGN PATENT DOCUMENTS

| | | | |
|---|---|---|---|
| JP | 2013-37190 A | | 2/2013 |
| JP | 2013037190 A | * | 2/2013 |
| JP | 2013-235095 A | | 11/2013 |
| JP | 2018-507443 A | | 3/2018 |
| JP | 2018-81253 A | | 5/2018 |
| JP | 2018-205479 A | | 12/2018 |
| JP | 2019-20486 A | | 2/2019 |
| KR | 10-2012-0034517 A | | 4/2012 |
| KR | 10-2012-0131714 A | | 12/2012 |
| KR | 10-2017-0112369 A | | 10/2017 |
| KR | 10-2017-0114619 A | | 10/2017 |
| KR | 10-2018-0004879 A | | 1/2018 |
| KR | 10-2020-0028078 A | | 3/2020 |
| WO | 2015/122083 A1 | | 8/2015 |

OTHER PUBLICATIONS

Office Action dated Dec. 19, 2023 in Japanese Application No. 2022-580854.
Office Action dated Aug. 19, 2024 in Korean Application No. 10-2020-0080143.
Supplementary European Search Report dated Jun. 21, 2024 in European Application No. 21833437.3.

* cited by examiner

Fig. 18
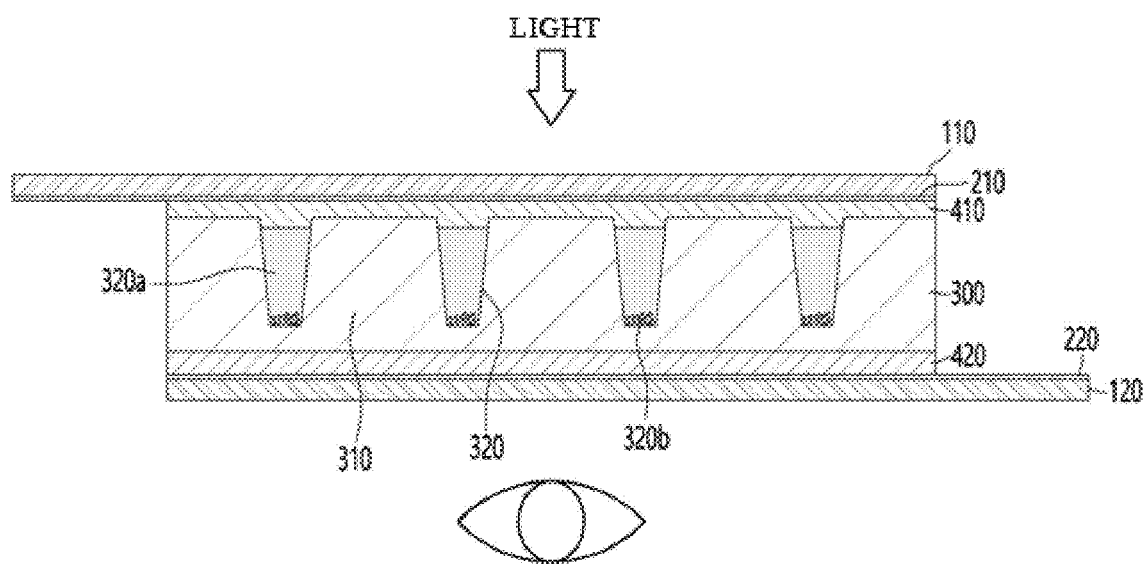
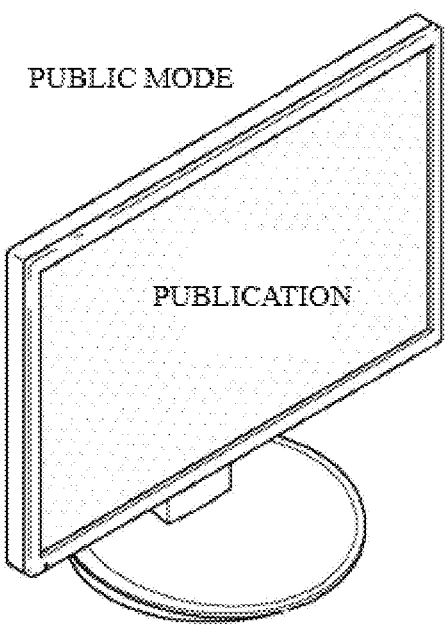

Fig. 19
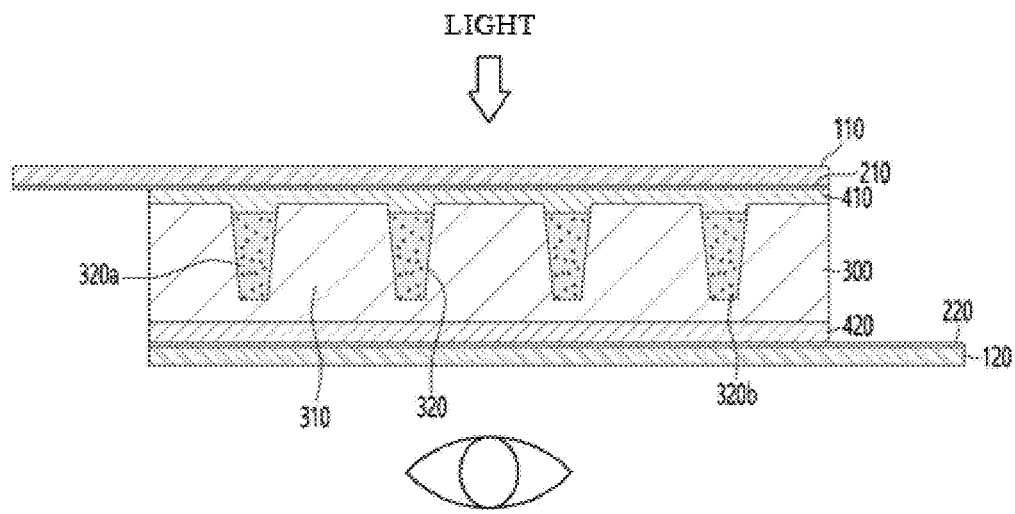
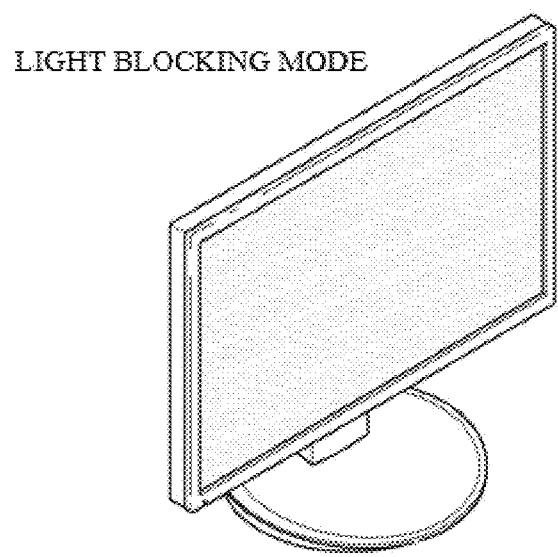

US 12,210,263 B2

OPTICAL PATH CONTROL MEMBER AND DISPLAY DEVICE COMPRISING SAME

CROSS-REFERENCE TO RELATED APPLICATIONS

This application is the U.S. national stage application of International Patent Application No. PCT/KR2021/008055, filed Jun. 28, 2021, which claims the benefit under 35 U.S.C. § 119 of Korean Application No. 10-2020-0080143, filed Jun. 30, 2020, the disclosures of each of which are incorporated herein by reference in their entirety.

TECHNICAL FIELD

An embodiment relates to an optical path control member, and to a display device including the same.

BACKGROUND ART

A light blocking film blocks transmitting of light from a light source, and is attached to a front surface of a display panel which is a display device used for a mobile phone, a notebook, a tablet PC, a vehicle navigation device, a vehicle touch, etc., so that the light blocking film adjusts a viewing angle of light according to an incident angle of light to express a clear image quality at a viewing angle needed by a user when the display transmits a screen.

In addition, the light blocking film may be used for the window of a vehicle, building or the like to shield outside light partially to inhibit glare, or to inhibit the inside from being visible from the outside.

That is, the light blocking film may be an optical path control member that controls the movement path of light to block light in a specific direction and transmit light in a specific direction. Accordingly, it is possible to control the viewing angle of the user by controlling a transmission angle of the light by the light blocking film.

Meanwhile, such a light blocking film may be divided into a light blocking film that can always control the viewing angle regardless of the surrounding environment or the user's environment and a switchable light blocking film that allow the user to turn on/off the viewing angle control according to the surrounding environment or the user's environment.

Such a switchable light blocking film may be implemented by converting a pattern portion into a light transmitting part and a light blocking part by filling the inside of the pattern portion with particles that may move when a voltage is applied and a dispersion liquid for dispersing the particles and by dispersing and aggregating the particles.

Such a dispersion liquid may be injected into each pattern portion by a capillary method. In this case, in order to inject the dispersion liquid in only one direction, a process of disposing a dam for controlling the flow of ink in an injection part and a process of sealing the injection part through a sealing part including a sealing material after all injection are required.

In this case, when the dam and the sealing part are disposed higher than an upper surface of the light blocking film, a step may occur, which may cause adhesion failure in adhesion to a display panel, etc., and when a height is disposed too low, there is a problem that ink overflows or sealing characteristics are deteriorated.

Accordingly, in order to solve the above problems, an optical path control member having a new structure capable of controlling heights of the dam and the sealing part and increasing an arrangement area of the sealing part is required.

DISCLOSURE

Technical Problem

An embodiment relates to an optical path control member capable of easily controlling a height and area of a dam and a sealing part to have improved reliability and to implement a thin thickness, and to a display device including the same.

Technical Solution

An optical path control member according to an embodiment includes: a first substrate; a first electrode disposed on the first substrate; a second substrate disposed on the first substrate; a second electrode disposed under the second substrate; and a light conversion unit disposed between the first electrode and the second electrode, wherein the second substrate and the second electrode include at least one hole penetrating the second substrate and the second electrode, and a sealing part is disposed inside the hole.

Advantageous Effects

In an optical path control member according to an embodiment, a dam part and a light conversion material mat be disposed inside an accommodating part, and a sealing part may be disposed between the dam part and the light conversion material to reduce a bezel region and improve sealing characteristics.

In detail, the dam part may be disposed inside the accommodating part to block the movement of the light conversion material so that the light conversion material may be disposed only between the dam parts.

In addition, it is possible to inhibit the light conversion material filled in the accommodating part from overflowing to the outside of the dam part by heights of the base part, the buffer layer, the second electrode, and the second substrate disposed above the dam part.

Therefore, since the dam part is disposed only inside the accommodating part and is not disposed in the partition wall part, the height of the dam part may be reduced, and it is possible to inhibit an increase of the overall thickness of the optical path control member according to an increase in height of the dam part.

In addition, since the sealing part is disposed inside the hole passing through the second substrate 120, the second electrode 220, the buffer layer 420, and the light conversion unit 300, sealing characteristics of the light conversion material may be improved by increasing an area where the sealing part 500 is disposed.

DESCRIPTION OF DRAWINGS

FIGS. 18 to 20 are views for describing one embodiment of the display device to which the optical path control member according to the embodiment is applied.

MODES OF THE INVENTION

Figure 1:
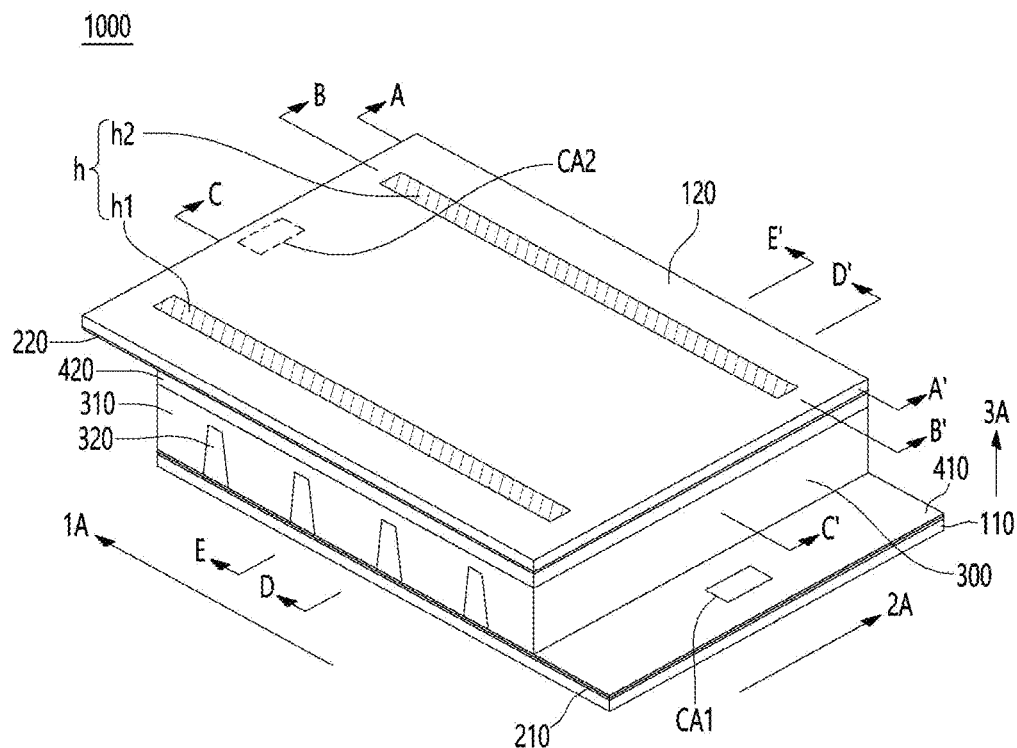
FIGS. 1 and 2 are perspective views of an optical path control member according to an embodiment.

Hereinafter, embodiments of the present invention will be described in detail with reference to the accompanying drawings. However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present invention are for describing the embodiments and are not intended to limit the present invention. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present invention, the terms such as first, second, A, B, (a), and (b) may be used. These terms are only used to distinguish the elements from other elements, and the terms are not limited to the essence, order, or order of the elements.

In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, an optical path control member according to an embodiment will be described with reference to drawings. The optical path control member described below relates to a switchable optical path control member driven in various modes according to electrophoretic particles moving by application of a voltage.

Referring to FIGS. 1 to 4, an optical path control member 1000 according to the first embodiment may include a first substrate 110, a second substrate 120, a first electrode 210, a second electrode 220, and a light conversion unit 300.

The first substrate 110 may support the first electrode 210. The first substrate 110 may be rigid or flexible.

In addition, the first substrate 110 may be transparent. For example, the first substrate 110 may include a transparent substrate capable of transmitting light.

The first substrate 110 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example, but the embodiment is not limited thereto.

In addition, the first substrate 110 may be a flexible substrate having flexible characteristics.

Further, the first substrate 110 may be a curved or bended substrate. That is, the optical path control member including the first substrate 110 may also be formed to have flexible, curved, or bent characteristics. Accordingly, the optical path control member according to the embodiment may be changed to various designs.

The first substrate 110 may extend in a first direction 1A, a second direction 2A, and a third direction 3A.

In detail, the first substrate 110 may include the first direction 1A corresponding to a length or width direction of the first substrate 110, a second direction 2A extending in a direction different from the first direction 1A and corresponding to the length or width direction of the first substrate 110, and a third direction 3A extending in a direction different from the first direction 1A and the second direction 2A and corresponding to a thickness direction of the first substrate 110.

For example, the first direction 1A may be defined as the length direction of the first substrate 110, the second direction 2A may be defined as the width direction of the first substrate 110 perpendicular to the first direction 1A, and the third direction 3A may be defined as the thickness direction of the first substrate 110. Alternatively, the first direction 1A may be defined as the width direction of the first substrate 110, the second direction 2A may be defined as the length direction of the first substrate 110 perpendicular to the first direction 1A, and the third direction 3A may be defined as the thickness direction of the first substrate 110.

Hereinafter, for convenience of description, the first direction 1A will be described as the length direction of the first substrate 110, the second direction 2A will be described as the width direction of the first substrate 110, and the third directions 3A will be described as the thickness direction of the first substrate 110.

The first electrode 210 may be disposed on one surface of the first substrate 110. In detail, the first electrode 210 may be disposed on an upper surface of the first substrate 110. That is, the first electrode 210 may be disposed between the first substrate 110 and the second substrate 120.

The first electrode 210 may include a transparent conductive material. For example, the first electrode 210 may include a conductive material having a light transmittance of about 80% or more. For example, the first electrode 210 may include a metal oxide such as indium tin oxide, indium zinc oxide, copper oxide, tin oxide, zinc oxide, titanium oxide, etc.

The first electrode 210 may have a thickness of 10 nm to 300 nm.

Alternatively, the first electrode 210 may include various metals to realize low resistance. For example, the first electrode 210 may include at least one metal of chromium (Cr), nickel (Ni), copper (Cu), aluminum (Al), silver (Ag), molybdenum (Mo). Gold (Au), titanium (Ti), and alloys thereof.

Figure 3:
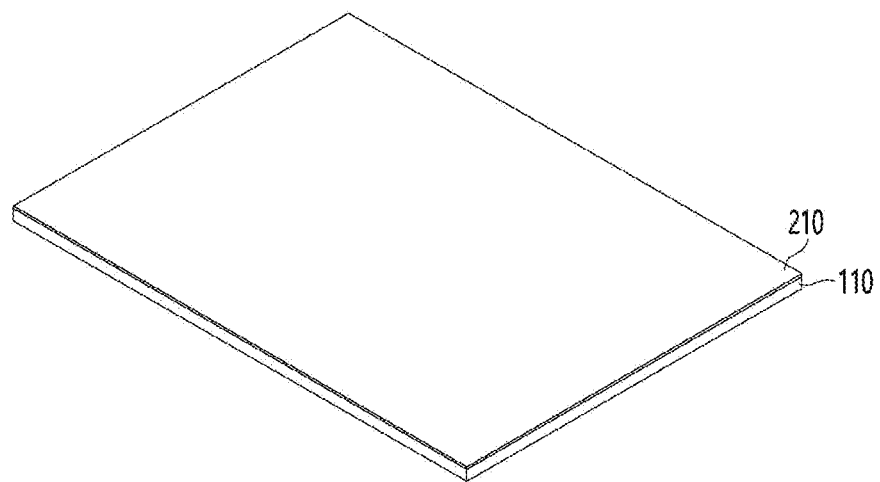
FIGS. 3 and 4 are a perspective view of a first substrate and a first electrode and a perspective view of a second substrate and a second electrode of an optical path control member according to an embodiment.

Referring to FIG. 3, the first electrode 210 may be disposed on the entire surface of one surface of the first substrate 110. In detail, the first electrode 210 may be disposed as a surface electrode on one surface of the first substrate 110. However, the embodiment is not limited thereto, and the first electrode 210 may be formed of a plurality of pattern electrodes having a uniform pattern such as a mesh or stripe shape.

For example, the first electrode 210 may include a plurality of conductive patterns. In detail, the first electrode 210 may include a plurality of mesh lines crossing each other and a plurality of mesh openings formed by the mesh lines.

Accordingly, even though the first electrode 210 includes a metal, the first electrode 210 is not visually recognized from the outside, so that visibility may be improved. In addition, the light transmittance is increased by the openings, so that the brightness of the optical path control member according to the embodiment may be improved.

The second substrate 120 may be disposed on the first substrate 110. In detail, the second substrate 120 may be disposed on the first electrode 210 on the first substrate 110.

The second substrate 120 may include a material capable of transmitting light. The second substrate 120 may include a transparent material. The second substrate 120 may include a material the same as or similar to that of the first substrate 110 described above.

For example, the second substrate 120 may include glass, plastic, or a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS). This is only an example, but the embodiment is not limited thereto.

In addition, the second substrate 120 may be a flexible substrate having flexible characteristics.

Further, the second substrate 120 may be a curved or bended substrate. That is, the optical path control member including the second substrate 120 may also be formed to have flexible, curved, or bent characteristics. Accordingly, the optical path control member according to the embodiment may be changed to various designs.

The second substrate 120 may also extend in the first direction 1A, the second direction 2A, and the third direction 3A in the same manner as the first substrate 110 described above.

In detail, the second substrate 120 may include the first direction 1A corresponding to a length or width direction of the second substrate 120, the second direction 2A extending in a direction different from the first direction 1A and corresponding to the length or width direction of the second substrate 120, and the third direction 3A extending in the direction different from the first direction 1A and the second direction 2A and corresponding to the thickness direction of the second substrate 120.

For example, the first direction 1A may be defined as the length direction of the second substrate 120, the second direction 2A may be defined as the width direction of the second substrate 120 perpendicular to the first direction 1A, and the third direction 3A may be defined as the thickness direction of the second substrate 120.

Alternatively, the first direction 1A may be defined as the width direction of the second substrate 120, the second direction 2A may be defined as the length direction of the second substrate 120 perpendicular to the first direction 1A, and the third direction 3A may be defined as the thickness direction of the second substrate 120.

Hereinafter, for convenience of description, the first direction 1A will be described as the length direction of the second substrate 120, the second direction 2A the second direction 2A will be described as the width direction of the second substrate 120, and the third directions 3A will be described as the thickness direction of the second substrate 120.

A hole h may be formed in the second substrate 120. In detail, the second substrate 120 may include a plurality of holes. In more detail, the second substrate 120 may include the plurality of holes spaced apart from each other.

For example, a first hole h1 and a second hole h2 disposed to be spaced apart from each other and extend in directions corresponding to each other may be formed in the second substrate 120.

The first hole h1 and the second hole h2 may have the same shape and area. Alternatively, the first hole h1 and the second hole h2 may have different shapes and/or areas.

The holes h1 and h2 may pass through the second substrate 120. That is, a depth of the hole may extend in the third direction 3A, and the holes h1 and h2 may pass through the second substrate 120.

The holes h1 and h2 may extend in the first direction 1A. That is, a longitudinal direction of the holes h1 and h2 may extend in the first direction 1A.

Lengths of the holes h1 and h2 may be greater than that of the accommodating part 320, and widths of the holes h1 and h2 may be greater than that of the accommodating part 320.

The holes h1 and h2 may be disposed to be spaced apart from both ends in the first direction 1A and both ends in the second direction 2A of the second substrate 120. That is, the holes h1 and h2 may be disposed inside the second substrate 120.

In addition, the embodiment is not limited thereto, and the holes h1 and h2 may be formed on at least one side surface of the ends of the first direction 1A and the second direction 2A by removing a part of the side surface of the second substrate 120 in order to implement a narrow bezel in a process of manufacturing the optical path control member. That is, the holes h1 and h2 may be formed such that a part of the hole is opened at at least one of the ends of side surfaces of the second substrate 120 in the first direction 1A and in the second direction 2A.

A sealing material may be disposed inside the holes h1 and h2. That is, the sealing material may be disposed inside the holes h1 and h2 so that the sealing part 500 may be disposed. In addition, a dam part 600 may be disposed in an outer region of the hole, that is, between the hole and an end of the second substrate 120 in the second direction. In addition, a light conversion material 330 may be disposed between the holes. The sealing part 500, the dam part 600, and the light conversion material 330 will be described in detail below.

The second electrode 220 may be disposed on one surface of the second substrate 120. In detail, the second electrode 220 may be disposed on a lower surface of the second substrate 120. That is, the second electrode 220 may be disposed on one surface of the second substrate 120 in which the second substrate 120 and the first substrate 110 face each other. That is, the second electrode 220 may be disposed to face the first electrode 210 on the first substrate 110. That is, the second electrode 220 may be disposed between the first electrode 210 and the second substrate 120.

The second electrode 220 may include a material the same as or similar to that of the first substrate 110 described above.

The second electrode 220 may include a transparent conductive material. For example, the second electrode 220 may include a conductive material having a light transmittance of about 80% or more. As an example, the second electrode 220 may include a metal oxide such as indium tin oxide, indium zinc oxide, copper oxide, tin oxide, zinc oxide, titanium oxide, etc.

The second electrode 220 may have a thickness of about 10 nm to about 300 nm.

Alternatively, the second electrode 220 may include various metals to realize low resistance. For example, the second electrode 220 may include at least one metal of chromium (Cr), nickel (Ni), copper (Cu), aluminum (Al), silver (Ag), molybdenum (Mo), gold (Au), titanium (Ti), and alloys thereof.

Figure 4:
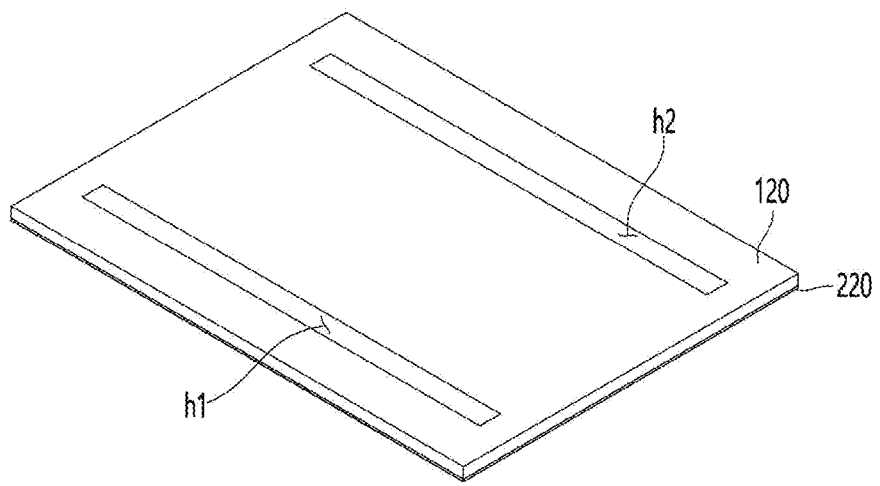

Referring to FIG. 4, the second electrode 220 may be disposed on the entire surface of one surface of the second substrate 120. In detail, the second electrode 220 may be disposed as a surface electrode on one surface of the second substrate 120 excluding a hole region. However, the embodiment is not limited thereto, and the second electrode 220 may be formed of a plurality of pattern electrodes having a uniform pattern such as a mesh or stripe shape.

For example, the second electrode 220 may include a plurality of conductive patterns. In detail, the second electrode 220 may include a plurality of mesh lines crossing each other and a plurality of mesh openings formed by the mesh lines.

Accordingly, even though the second electrode 220 includes a metal, the second electrode 220 is not visually recognized from the outside, so that visibility may be improved. In addition, the light transmittance is increased by the openings, so that the brightness of the optical path control member according to the embodiment may be improved.

The holes h1 and h2 described above may be formed penetrating the second electrode 220. That is, the holes h1 and h2 may pass through the second substrate 120 and the second electrode 220 in the third direction.

The first substrate 110 and the second substrate 120 may have sizes corresponding to each other. The first substrate 110 and the second substrate 120 may have sizes the same as or similar to each other.

In detail, a first length extending in the first direction 1A of the first substrate 110 may have a size the same as or similar to a second length extending in the first direction 1A of the second substrate 120.

For example, the first length and the second length may have a size of 300 mm to 400 mm.

In addition, a first width extending in the second direction 2A of the first substrate 110 may have a size the same as or similar to a second width extending in the second direction of the second substrate 120.

For example, the first width and the second width may have a size of 150 mm to 200 mm.

In addition, a first thickness extending in the third direction 3A of the first substrate 110 may have a size the same as or similar to a second thickness extending in the third direction of the second substrate 120.

For example, the first thickness and the second thickness may have a size of 1 mm or less.

Referring to FIG. 1, the first substrate 110 and the second substrate 120 may be disposed to be misaligned from each other.

In detail, the first substrate 110 and the second substrate 120 may be disposed at positions misaligned from each other in the first direction 1A. In detail, the first substrate 110 and the second substrate 120 may be disposed so that side surfaces of the substrates are misaligned from each other.

Accordingly, the first substrate 110 may be disposed to protrude in one direction of the first direction 1A, and the second substrate 120 may be disposed to protrude in the other direction of the first direction 1A.

That is, the first substrate 110 may include a first protrusion protruding in one direction of the first direction 1A, and the second substrate 110 may include a second protrusion protruding in the other direction of the first direction 1A.

Accordingly, the optical path control member 1000 may include a region where the first electrode 210 is exposed on the first substrate 110 and a region where the second electrode 220 is exposed under the second substrate 120.

That is, the first electrode 210 disposed on the first substrate 110 may be exposed at the first protrusion, and the second electrode 220 disposed under the second substrate 120 may be exposed at the second protrusion.

Pad portions CA1 and CA2 may be disposed on the first electrode 210 and the second electrode 220 exposed from the protrusions and may be connected to an external printed circuit board.

For example, the pad portions CA1 and CA2 may include a conductive adhesive including at least one of an anisotropic conductive film (ACF) and an anisotropic conductive paste (ACP).

That is, the pad portion is disposed on the first electrode 210 and the second electrode 220, and the pad portion and the printed circuit board may be adhered through the conductive adhesive including at least one of the anisotropic conductive film (ACF) and the anisotropic conductive paste (ACP), or the first electrode 210, the second electrode 220, and the printed circuit board may be adhered through the conductive adhesive including at least one of the anisotropic conductive film (ACF) and the anisotropic conductive paste (ACP) without an additional pad portion.

Figure 2:
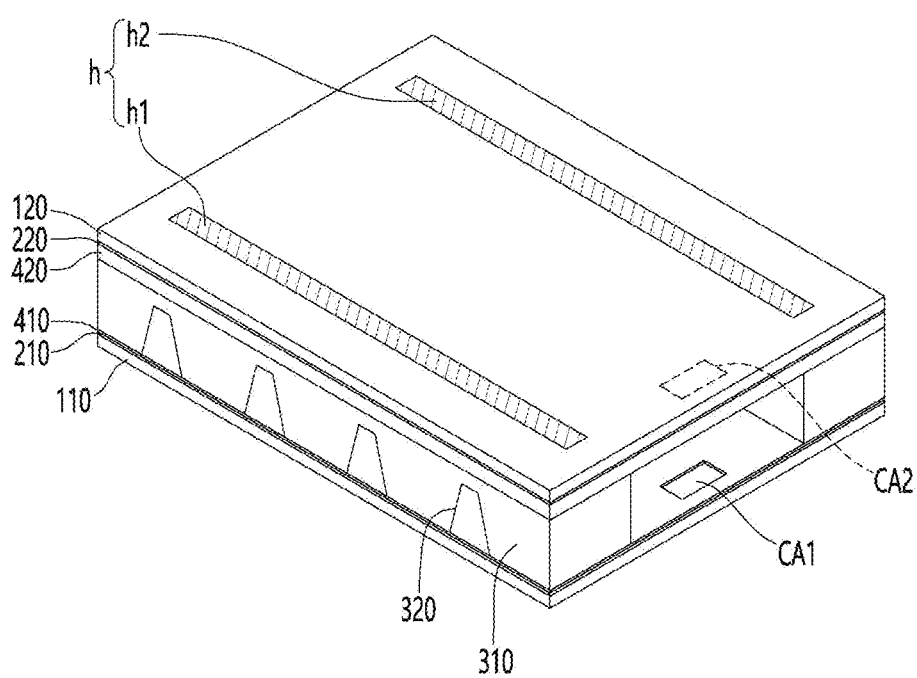

Alternatively, referring to FIG. 2, the first substrate 110 and the second substrate 120 may be disposed at positions corresponding to each other. In detail, the first substrate 110 and the second substrate 120 may be disposed so that side surfaces thereof correspond to each other.

Accordingly, the first substrate 110 may be disposed to protrude in one direction of the first direction 1A, and the second substrate 120 may also be disposed to protrude in one direction of the first direction 1A, that is, in the same direction as the first substrate 110.

That is, the first substrate 110 may include a first protrusion protruding in one direction in the first direction 1A, and the second substrate may also include a second protrusion protruding in one direction in the first direction 1A.

That is, the first protrusion and the second protrusion may protrude in the same direction.

Accordingly, the optical path control member 1000 may include a region where the first electrode 210 is partially exposed on the first substrate 110 and a region where the second electrode 220 is partially exposed under the second substrate 120.

That is, the first electrode 210 disposed on the first substrate 110 may be exposed at the first protrusion, and the second electrode 220 disposed under the second substrate 120 may be exposed at the second protrusion.

The pad portions CA1 and CA2 may be disposed on the first electrode 210 and the second electrode 220 exposed from the protrusions and may be connected to the external printed circuit board.

For example, the pad portions CA1 and CA2 may include the conductive adhesive including at least one of the anisotropic conductive film (ACF) and the anisotropic conductive paste (ACP).

That is, the pad portion is disposed on the first electrode 210 and the second electrode 220, and the pad portion and the printed circuit board may be adhered through the conductive adhesive including at least one of the anisotropic conductive film (ACF) and the anisotropic conductive paste (ACP), or the first electrode 210, the second electrode 220, and the printed circuit board may be adhered through the conductive adhesive including at least one of the anisotropic conductive film (ACF) and the anisotropic conductive paste (ACP) without an additional pad portion.

The light conversion unit 300 may be disposed between the first substrate 110 and the second substrate 120. In detail, the light conversion unit 300 may be disposed between the first electrode 210 and the second electrode 220.

An adhesive layer or a buffer layer may be disposed between at least one of between the light conversion unit 300 and the first substrate 110 or between the light conversion unit 300 and the second substrate 120, and the first substrate 110, the second substrate 120, and the light conversion unit 300 may be adhered to each other by the adhesive layer and/or the buffer layer.

For example, an adhesive layer 410 may be disposed between the first electrode 210 and the light conversion unit 300, thereby adhering the first substrate 110 and the light conversion unit 300.

In addition, a buffer layer 420 may be disposed between the second electrode 220 and the light conversion unit 300, thereby improving adhesion between the second electrode 220 including different materials and the light conversion unit 300.

The hole described above may be formed to pass through the buffer layer 420 and the light conversion unit 300. That is, the hole may sequentially pass through the second substrate 120, the second electrode 220, the buffer layer 420, and the light conversion unit 300 in the third direction.

The light conversion unit 300 may include a plurality of partition wall parts and accommodating parts. The light conversion material 330 including light conversion particles that move by application of a voltage and a dispersion liquid for dispersing the light conversion particles may be disposed in the accommodating part 320, and light transmission characteristics of the optical path control member may be changed by the light conversion particles.

In addition, the sealing part 500 for sealing the light conversion material 330 and the dam part 600 for easily injecting the light conversion material 330 may be disposed in the accommodating part 320.

Hereinafter, with reference to FIGS. 5 to 14, the light conversion material 330, the sealing part 500, and the dam part 600 disposed in the hole h and the accommodating part 320 described above will be described in detail.

Figure 5:
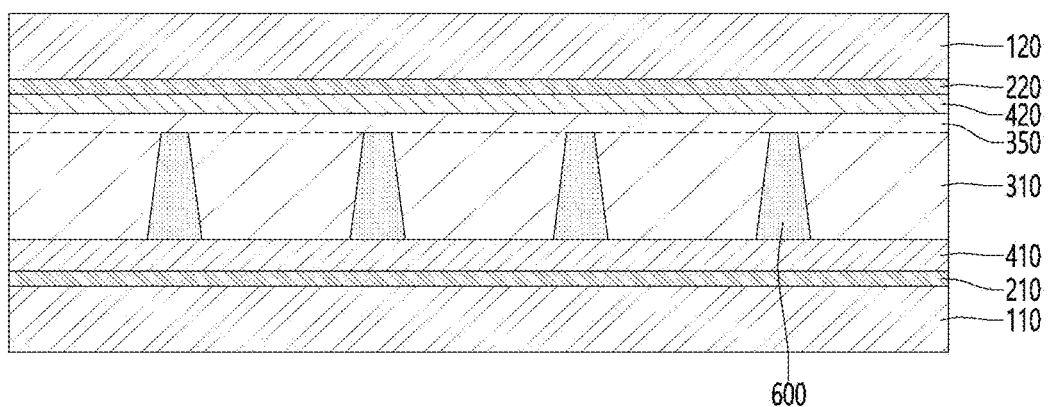
FIG. 5 is a cross-sectional view taken along line A-A' in FIG. 1.

FIG. 5 is a cross-sectional view taken along line A-A' in FIG. 1. That is, FIG. 5 is a cross-sectional view taken a hole formed in the second substrate 120 and between one end or the other end of the second substrate 120 in the second direction 2A.

Referring to FIG. 5, the light conversion unit 300 may a partition wall part 310 and an accommodating part 320.

The partition wall part 310 may be defined as a partition wall part dividing the accommodating part. That is, the partition wall part 310 may transmit light as a barrier region dividing a plurality of accommodating parts. That is, light emitted in the direction of the first substrate 110 or the second substrate 120 may pass through the partition wall part.

The partition wall part 310 and the accommodating part 320 may be disposed to have different widths. For example, a width of the partition wall part 310 may be greater than that of the accommodating part 320.

The partition wall part 310 and the accommodating part 320 may be alternately disposed with each other. In detail, the partition wall part 310 and the accommodating part 320 may be alternately disposed with each other. That is, each of the partition wall parts 310 may be disposed between the accommodating parts 320 adjacent to each other, and each of the accommodating parts 320 may be disposed between the adjacent partition wall parts 310.

The partition wall part 310 may include a transparent material. The partition wall part 310 may include a material that may transmit light.

The partition wall part 310 may include a resin material. For example, the partition wall part 310 may include a photo-curable resin material. As an example, the partition wall part 310 may include a UV resin or a transparent photoresist resin. Alternatively, the partition wall part 310 may include urethane resin or acrylic resin.

The accommodating part 320 may be formed to partially penetrate the light conversion unit 300. Accordingly, the accommodating part 320 may be disposed in contact with the adhesive layer 410 and may be disposed to be spaced apart from the buffer layer 420. Accordingly, a base part 350 may be formed between the accommodating part 320 and the buffer layer 420.

The accommodating part 320 may extend in a direction different from that of the holes h1 and h2. That is, the accommodating part 320 may extend in a direction different from the first direction. For example, the accommodating part 320 may extend in the second direction. In addition, the accommodating part 320 may extend to have a predetermined inclination angle with respect to the second direction. For example, the accommodating part 320 may extend to have an inclination angle of 20° or less with respect to the second direction.

The resin material may be filled in the accommodating part 320 and the dam part 600 may be disposed. That is, the dam part 600 may be disposed in the accommodating part 320 between the hole formed in the second substrate 120 and one end of the second substrate 120 in the second direction 2A and between the hole formed in the second substrate 120 and the other end of the second substrate 120A in the second direction 2A. That is, the dam part 600 may be disposed the outer region of the holes h1 and h2.

The dam part 600 may be disposed while completely or partially filling the inside of the accommodating part 320. For example, the dam part 600 may be disposed while partially filling the inside of the accommodating part 320. Accordingly, the adhesive layer 410 may be disposed while partially filling the inside of the accommodating part 320. That is, only the dam part 600 may be disposed in the accommodating part 320 or the dam part 600 and the adhesive layer 410 may be disposed together.

When the light conversion material 330 including a dispersion in which light conversion particles are dispersed is filled in the accommodating part 320, the dam part 600 may inhibit the light conversion material from moving in a direction between the hole formed in the second substrate 120 and one end of the second direction 2A of the second substrate 120. Accordingly, the light conversion material 330 may be injected only into a region between the holes by the dam part.

The dam part 600 may be formed on the outside of the plurality of accommodating parts, for example, inside the accommodating part disposed on the outermost side after forming the second electrode 220 and the buffer layer 420 on the second substrate 120, forming the partition wall part 310 and the accommodating part 320 in a resin material forming the light conversion unit 300, and adhering the buffer layer 420 and the light conversion unit 300.

Figure 6:
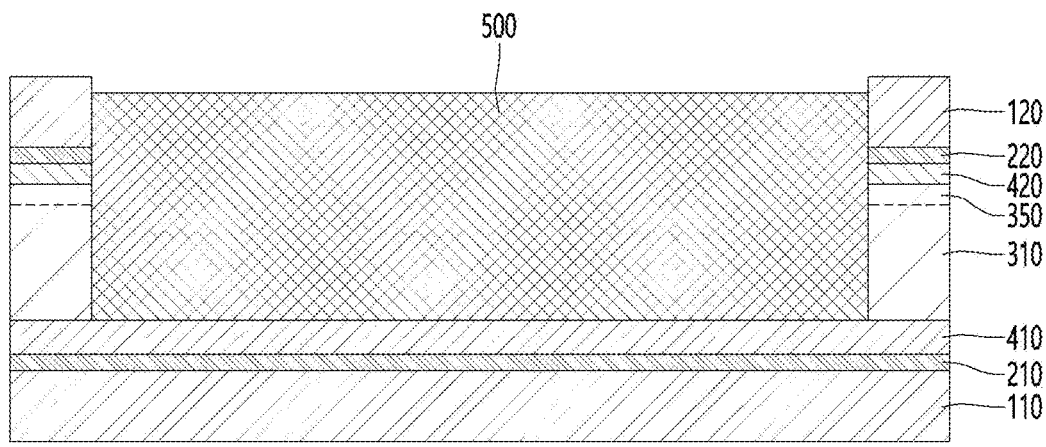
FIG. 6 is a cross-sectional view taken along line B-B' in FIG. 1.

FIG. 6 is a cross-sectional view of a region B-B' of FIG. 1. That is, FIG. 6 is a cross-sectional view of the first hole and the second hole formed in the second substrate 120 by cutting one end and the other end.

Referring to FIG. 6, the holes h1 and h2 may be formed to pass through the second substrate 120, the second electrode 220, the buffer layer 420, and the light conversion unit 300.

In detail, after forming the second electrode 220 and the buffer layer 420 on the second substrate 120, forming the partition wall part 310 and the accommodating part 320 in the resin material forming the light conversion unit 300, and adhering the buffer layer 420 and the light conversion unit 300, the holes h1 and h2 extending from the second substrate 120 toward the light conversion unit 300 may be formed.

That is, the first hole h1 and the second hole h2 may pass through the second substrate 120, the second electrode 220, and the buffer layer 420 and may be formed by removing both the base part 350 and the partition wall part 310.

Accordingly, the adhesive layer 410 may be exposed through the holes h1 and h2. That is, the adhesive layer 410 may be exposed through the bottom surfaces of the holes h1 and h2.

The sealing part 500 formed of a sealing material may be disposed inside the hole formed in the second substrate 220. That is, the sealing part 500 including a sealing material such as epoxy may be disposed inside the hole formed to pass through the second substrate 120, the second electrode 220, the buffer layer 420, and the light conversion unit 300. For example, the sealing material may include a material different from a material forming the partition wall part 310 and the base part 350. As an example, the sealing material may include the epoxy.

Accordingly, the sealing part 500 may be disposed in contact with the side surface of the second substrate 120. In addition, the sealing part 500 may be disposed in contact with a side surface of the second electrode 220. In addition, the sealing part 500 may be disposed in contact with a side surface of the buffer layer 420. In addition, the sealing part 500 may be disposed in contact with a side surface of the base part 350. In addition, the sealing part 500 may be disposed in contact with a side surface of the partition wall part 310. In addition, the sealing part 500 may be disposed in direct contact with the adhesive layer 410.

A thickness T of the sealing part 500 may be equal to or smaller than a sum of those of the partition wall part 310, the base part 350, the buffer layer 420, the second electrode 220, and the second substrate 120.

That is, an upper surface of the sealing part 500 may be disposed on the same plane as an upper surface of the second substrate 120 or may be lower. Accordingly, the upper surface of the sealing part 500 may be formed without a step on the same plane as the upper surface of the second substrate 120, or the upper surface of the sealing part 500 may be disposed with a step st such that the upper surface thereof is low.

Accordingly, it is possible to reduce the overall thickness of the optical path control member by inhibiting the overall thickness of the optical path control member from being increased due to a height of the sealing part 500.

The sealing part 500 may serve to seal the light conversion material filled in the accommodating part 320 between the first hole and the second hole. That is, after supplying the light conversion material to the first hole h1, the light conversion material may move in a direction of the second hole h2 from the first hole h1 through a capillary method to be injected into the accommodating part 320 between the first hole h1 and the second hole h2.

Then, in order to seal both ends of the light conversion material injected into the accommodating part 320, the sealing material may be filled into the holes to form the sealing part 500, and the light conversion material injected into the accommodating part 320 may be sealed by filling the first hole h1 and the second hole h2 by the sealing part 500.

In this case, a width of the first hole h1 may be greater than that of the second hole h2. The first hole h1 is a region for injecting the light conversion material 330, and when the light conversion material is injected, the width of the first hole h1 may be formed to be wide so as to easy control a difference between an amount of the light conversion material emitted from the light conversion material injection equipment and an amount of the light conversion material entering the accommodating part.

In addition, the second hole h2 is a region that serves to move the light conversion material from the first hole h1 to the second hole h2 using a device that sucks the light conversion material and may be formed smaller than the width of the first hole h1.

When the holes defined as the injection part of the light conversion material are formed by removing all of the partition wall parts, and thus a moving path of the light conversion material in the injection part may be increased, and accordingly, an injection speed of the light conversion material may be improved.

In addition, since all of the partition wall parts are removed from the holes, when the sealing material is disposed inside the holes after injecting the light conversion material, an area where the sealing material is disposed may be increased, thereby improving the sealing properties of the light conversion material.

Figure 7:
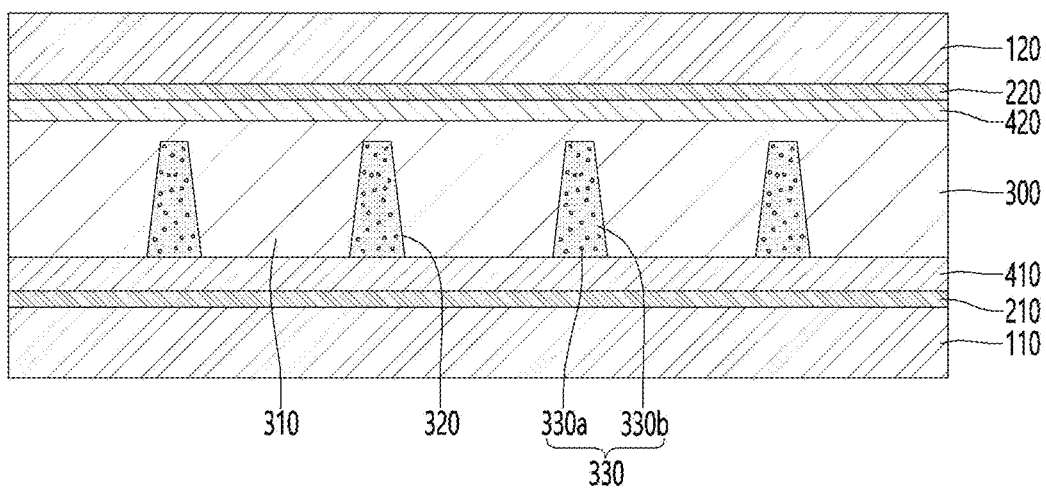
FIGS. 7 and 8 are cross-sectional views taken along line C-C' in FIG. 1.
Figure 8:
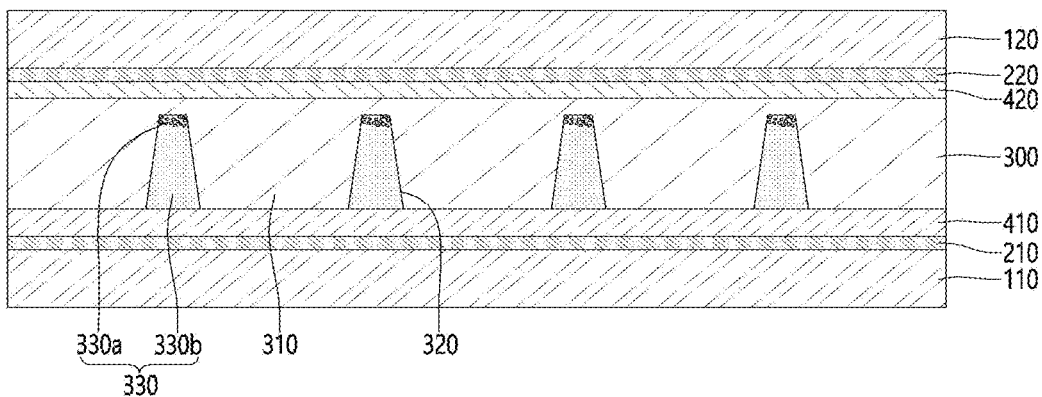

FIGS. 7 and 8 are cross-sectional views taken along line C-C' of FIG. 1. That is, FIGS. 7 and 8 are cross-sectional views of a region between the first hole and the second hole formed in the second substrate 120.

Referring to FIGS. 7 and 8, a light conversion material 330 including light conversion particles 330a and a dispersion liquid 330b in which the light conversion particles 330a are dispersed may be disposed in the accommodating part 320.

The dispersion liquid 330b may be a material for dispersing the light conversion particles 330a. The dispersion liquid 330b may include a transparent material. The dispersion liquid 330b may include a non-polar solvent. In addition, the dispersion liquid 330b may include a material capable of transmitting light. For example, the dispersion liquid 330b may include at least one of a halocarbon-based oil, a paraffin-based oil, and isopropyl alcohol.

The light conversion particles 330a may be disposed to be dispersed in the dispersion liquid 330b. In detail, the plurality of light conversion particles 330a may be disposed to be spaced apart from each other in the dispersion liquid 330b.

The light conversion particles 330a may include a material capable of absorbing light. That is, the light conversion particles 330a may be light absorbing particles. The light conversion particles 330a may have a color. For example, the light conversion particles 330a may have a black-based color. As an example, the light conversion particles 330a may include carbon black.

The light conversion particles 330a may have a polarity by charging a surface thereof. For example, the surface of the light conversion particles 330a may be charged with a negative (−) charge. Accordingly, according to the application of the voltage, the light conversion particles 330a may move toward the first electrode 210 or the second electrode 220.

The light transmittance of the accommodating part 320 may be changed by the light conversion particles 330a. In detail, the accommodating part 320 may be converted into the light blocking part and the light transmitting part by changing the light transmittance due to the movement of the light conversion particles 330a. That is, the accommodating part 320 may change the transmittance of light passing through the accommodating part 320 by dispersion and aggregation of the light conversion particles 330a disposed inside the dispersion liquid 330b.

For example, the optical path control member according to the embodiment may be switched from a first mode to a second mode or from the second mode to the first mode by a voltage applied to the first electrode 210 and the second electrode 220.

In detail, in the optical path control member according to the embodiment, the accommodating part 320 becomes the light blocking part in the first mode, and light of a specific angle may be blocked by the accommodating part 320. That is, a viewing angle of the user viewing from the outside is narrowed, so that the optical path control member may be driven in a privacy mode.

In addition, in the optical path control member according to the embodiment, the accommodating part 320 becomes the light transmitting part in the second mode, and in the optical path control member according to the embodiment, light may be transmitted through both the partition wall part 310 and the accommodating part 320. That is, the viewing angle of the user viewing from the outside may be widened, so that the optical path control member may be driven in a public mode.

Switching from the first mode to the second mode, that is, the conversion of the accommodating part 320 from the light blocking part to the light transmitting part may be realized by movement of the light conversion particles 330a of the accommodating part 320. That is, the light conversion particles 330a may have a charge on the surface thereof and may move toward the first electrode or the second electrode according to the application of a voltage according to characteristics of the charge. That is, the light conversion particles 330a may be electrophoretic particles.

For example, when a voltage is not applied to the optical path control member from the outside, the light conversion particles 330a of the accommodating part 320 are uniformly dispersed in the dispersion liquid 330b, and the accommodating part 320 may block light by the light conversion particles. Accordingly, in the first mode, the accommodating part 320 may be driven as the light blocking part.

In addition, when a voltage is applied to the optical path control member from the outside, the light conversion particles 330a may move. For example, the light conversion particles 330a may move toward one end or the other end of the accommodating part 320 by a voltage transmitted through the first electrode 210 and the second electrode 220. That is, the light conversion particles 330a may move from the accommodating part 320 toward the first electrode 210 or the second electrode 220.

For example, when a voltage is applied to the first electrode 210 and/or the second electrode 220, an electric field is formed between the first electrode 210 and the second electrode 220, and the light conversion particles 330a charged with the negative charge may move toward a positive electrode of the first electrode 210 and the second electrode 220 using the dispersion liquid 330b as a medium.

As an example, in the initial mode or when the voltage is not applied to the first electrode 210 and/or the second electrode 220, as shown in FIG. 7, the light conversion particles 330a may be uniformly dispersed in the dispersion liquid 330b, and the accommodating part 320 may be driven as the light blocking part.

In addition, when the voltage is applied to the first electrode 210 and/or the second electrode 220, as shown in FIG. 8, the light conversion particles 330a may move toward the second electrode 220 in the dispersion liquid 330b. That is, the light conversion particles 330a move in one direction, and the accommodating part 320 may be driven as the light transmitting part.

Accordingly, the optical path control member according to the embodiment may be driven in two modes according to a user's surrounding environment. That is, when the user requires light transmission only at a specific viewing angle, the accommodating part is driven as the light blocking part, or in an environment in which the user requires high brightness, a voltage may be applied to drive the accommodating part as the light transmitting part.

Therefore, since the optical path control member according to the embodiment may be implemented in two modes according to the user's requirement, the optical path control member may be applied regardless of the user's environment.

FIGS. 9 to 13 are cross-sectional views taken along line D-D' of FIG. 1. That is, FIGS. 9 to 13 are cross-sectional views of one end and the other end in the second direction of one of the plurality of accommodating parts of the light conversion unit.

Figure 9:
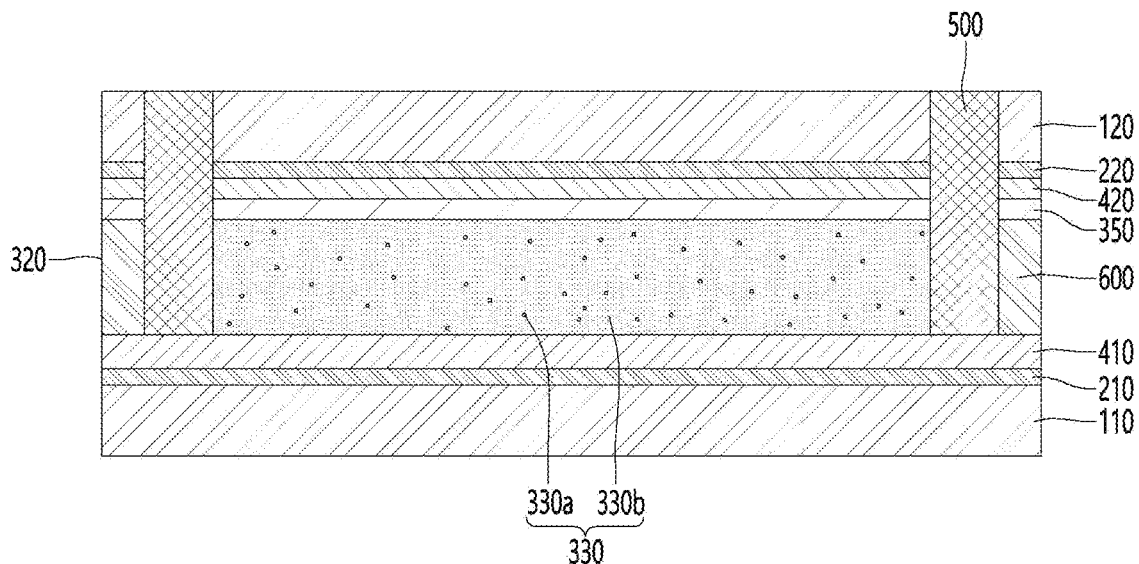
FIGS. 9 to 13 are cross-sectional views taken along line D-D' in FIG. 1.
Figure 10:
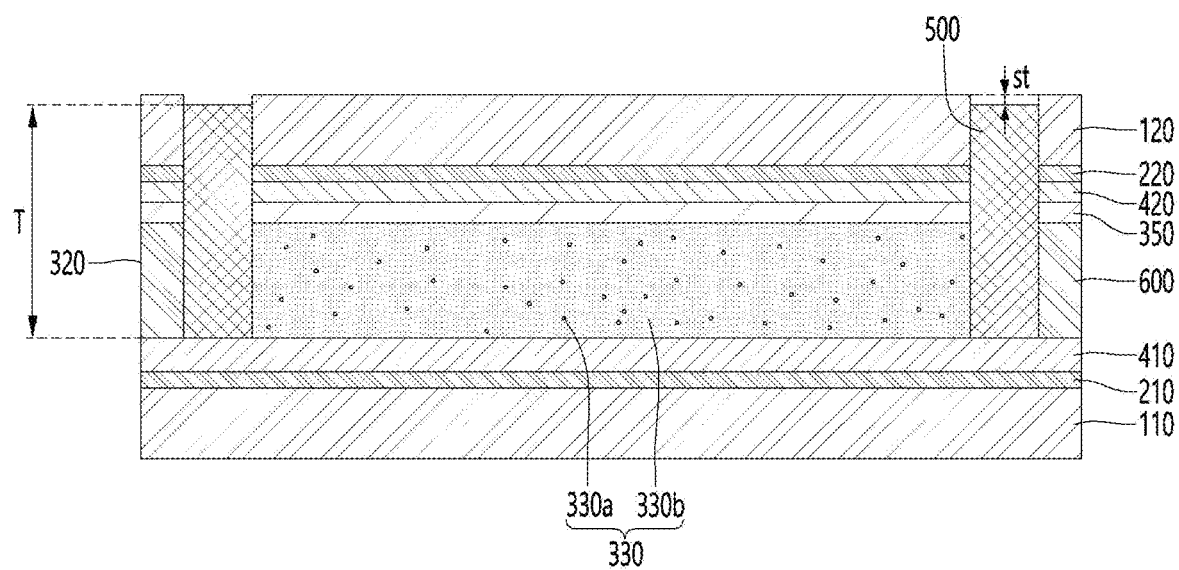

Referring to FIGS. 9 and 10, the light conversion material 330, the sealing part 500, and the dam part 600 may be disposed in the accommodating part 320. That is, the light conversion material 330 may be disposed between the sealing parts 500, and the dam part 600 may be disposed outside the sealing parts 500.

That is, the light conversion material 330, the sealing part 500, and the dam part 600 may be sequentially disposed while extending from a central region of the accommodating part 320 toward one end.

The light conversion material 330, the sealing part 500, and the dam part 600 may be disposed in contact with each other inside the accommodating part 320. That is, the light conversion material 330 may be disposed in direct contact with the sealing part 500, the sealing part 500 may be disposed in direct contact with the light conversion material 330 and the dam part 600, and the dam part 600 may be disposed in direct contact with the sealing part 500.

As described above, the sealing part 500 disposed inside the holes may be disposed below a height up to the upper surface of the second substrate 120.

Referring to FIG. 9, the sealing part 500 may be disposed to a height at which the upper surface of the sealing part 500 is disposed on the same plane as the upper surface of the second substrate 120.

Alternatively, referring to FIG. 10, the sealing part 500 may be disposed to have a thickness T in which the upper surface of the sealing part 500 is disposed on a plane lower than the upper surface of the second substrate 120, and accordingly, the upper surface of the sealing part 500 and the upper surface of the second substrate 120 may form the step st.

In the optical path control member according to the embodiment, by disposing the dam part and the light conversion material inside the accommodating part and disposing the sealing part between the dam part and the light conversion material, it is possible to reduce a bezel region and to improve the sealing characteristics.

In detail, the dam part 600 may be disposed inside the accommodating part to block the movement of the light conversion material so that the light conversion material may be disposed only between the dam parts. In addition, it is possible to inhibit the light conversion material 330 filled in the accommodating part 320 from overflowing the outside of the dam part 600 by heights of the base part 350, the buffer layer 420, the second electrode 220, and the second substrate 120 disposed above the dam part 600.

Therefore, since the dam part 600 is disposed only inside the accommodating part 320 and is not disposed in the partition wall part 310, the height of the dam part 600 may be reduced, and it is possible to inhibit an increase of the overall thickness of the optical path control member according to an increase in height of the dam part.

In addition, since the sealing part 500 is disposed inside the hole passing through the second substrate 120, the second electrode 220, the buffer layer 420, and the light conversion unit 300, the sealing characteristics of the light conversion material may be improved by increasing an area where the sealing part 500 is disposed.

Figure 11:
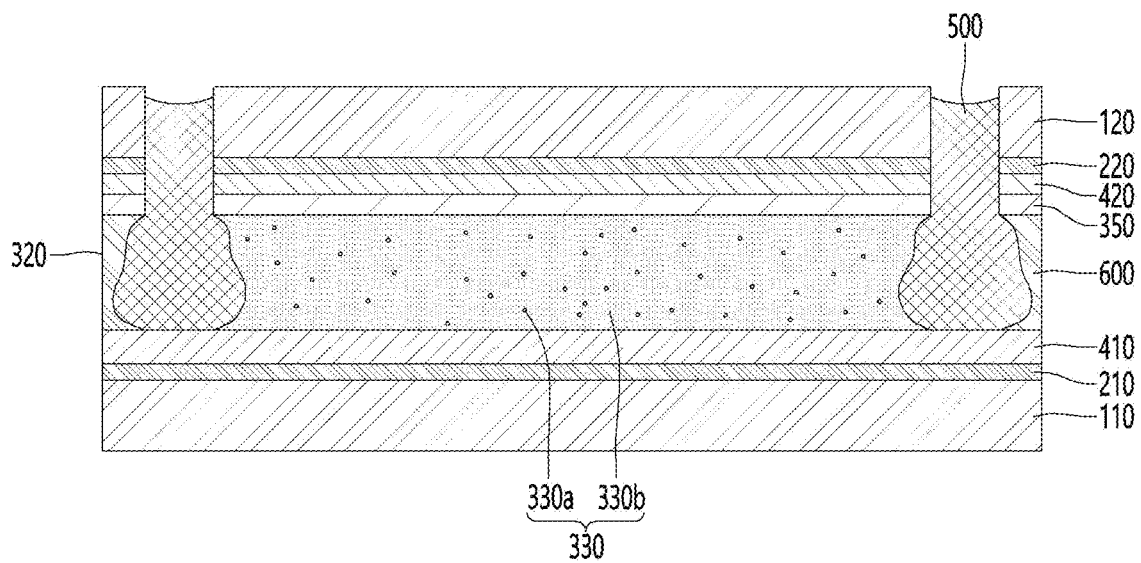
Figure 12:
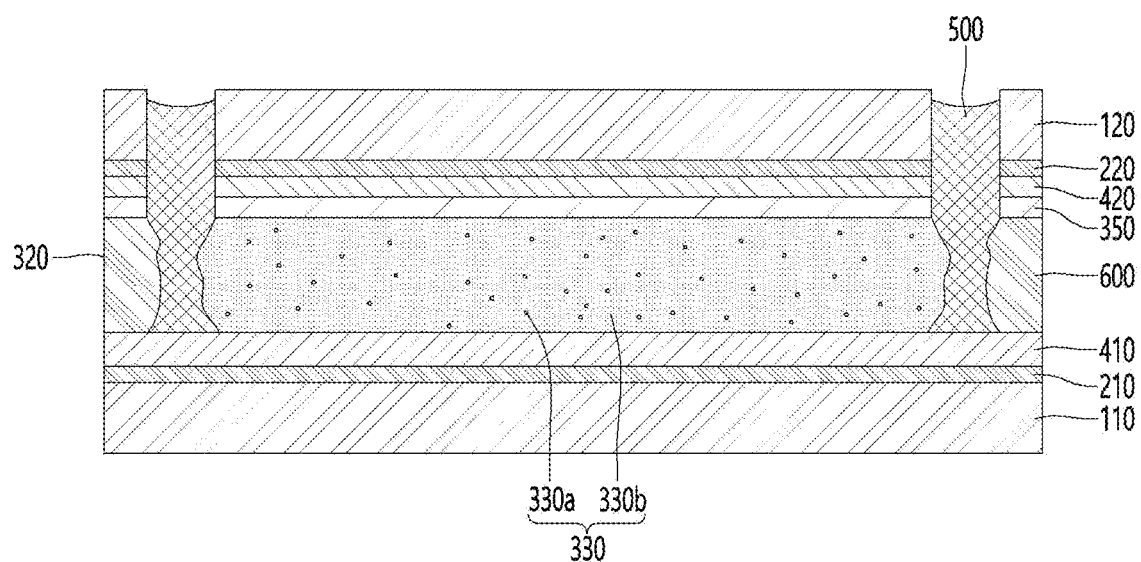
Figure 13:
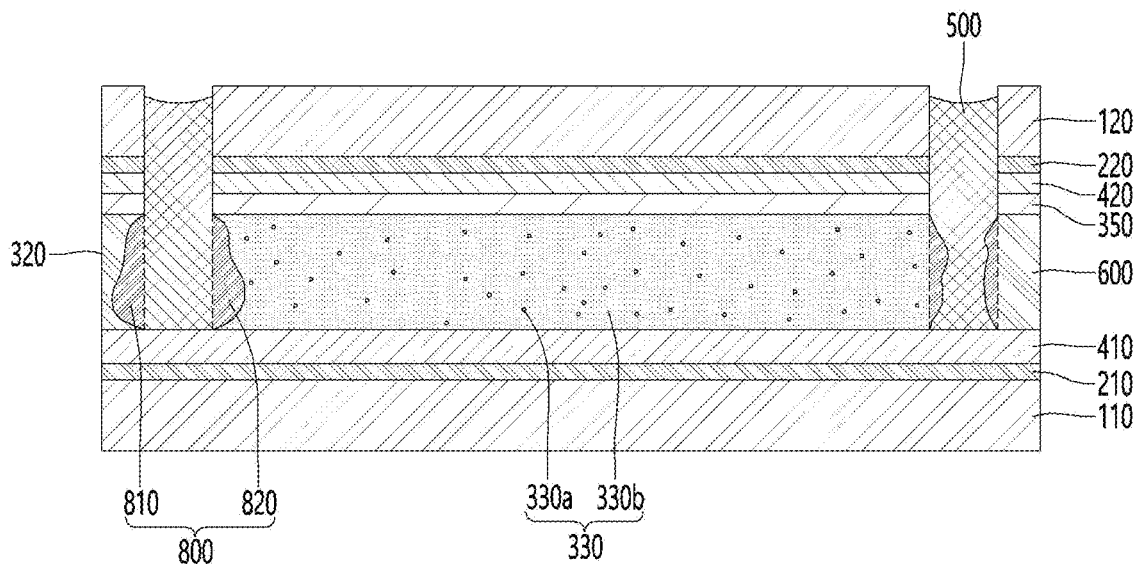

FIGS. 11 to 13 are views for describing various arrangement examples of the light conversion material 330, the sealing part 500, and the dam part 600 disposed inside the accommodating part 320.

Referring to FIG. 11, the sealing part 500 may include a region having an increased width while extending from the second substrate 120 toward the first substrate 110. That is, the sealing part 500 may be disposed to be diffused in a direction of the light conversion material 330 and the dam part 600 inside the accommodating part 320. That is, at least one accommodating part among the plurality of accommodating parts may include a region in which the sealing part 500 extends from the second substrate 120 toward the first substrate 110 and has an increased width.

Accordingly, when an injection amount of the light conversion material in one accommodating part is smaller than that of the light conversion material in the other accommodating part and a void region is formed in one accommodating part, the void region may be filled with the sealing part. Accordingly, the light conversion material and the sealing part may be densely formed without a void region inside the accommodating part. Accordingly, it is possible to inhibit generation of air inside the accommodating part, thereby improving reliability and light conversion efficiency of the optical path control member.

Alternatively, referring to FIG. 12, the sealing part 500 may include a region having a reduced width while extending from the second substrate 120 toward the first substrate 110. That is, the light conversion material 330 may be disposed to be diffused in a direction of the sealing part 500 inside the accommodating part 320, and the dam part 600 may be disposed to be diffused in the direction of the sealing part 500 inside the accommodating part 320. That is, at least one accommodating part among the plurality of accommodating parts may include a region in which the sealing part 500 extends from the second substrate 120 toward the first substrate 110 and has a reduced width.

Accordingly, since an injection amount of the light conversion material in one accommodating part is greater than an injection amount of the other accommodating part, it is possible to inhibit the sealing part from protruding above the substrate due to the injection amount of the sealing part. In addition, accordingly, the light conversion material and the sealing part may be densely formed without the void region inside the accommodating part. Accordingly, it is possible to inhibit generation of air inside the accommodating part, thereby improving the reliability and light conversion efficiency of the optical path control member.

Alternatively, referring to FIG. 13, a mixing region 800 may be formed inside the accommodating part 320. In detail, a first mixing region 810 formed by mixing the sealing material and the dam material may be formed between the sealing part 500 and the dam part 600, and a second mixed region 820 formed by mixing the sealing material and the light conversion material may be formed between the sealing part 500 and the light conversion material 330.

This may be formed by adjusting a material and curing time of the sealing material and the light conversion material of the sealing part, and even though the optical path control member changes a mode several times through the mixing region, it is possible to inhibit air from generating inside the sealing part by the sealing material from deeply penetrating into the accommodating part or penetrating the light conversion material of the accommodating part into the sealing part.

Figure 14:
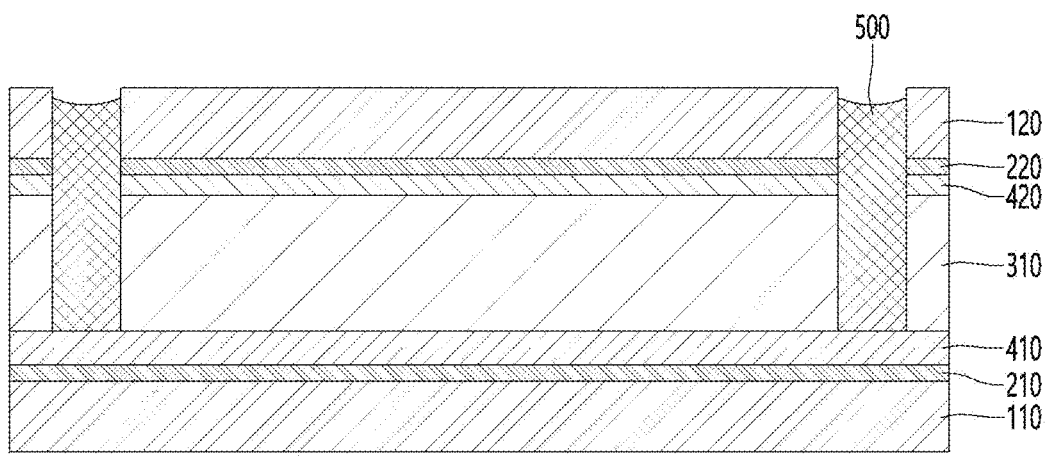
FIG. 14 is a cross-sectional view taken along line E-E' in FIG. 1.

FIG. 14 is a cross-sectional view taken along line E-E" of FIG. 1. That is, FIG. 14 is a cross-sectional view of one end and the other end of one of the plurality of partition wall parts of the light conversion unit.

Referring to FIG. 14, the partition wall part 310 may be removed in a region where the sealing part 500 is disposed. That is, the sealing part 500 may also be disposed in a region where the partition wall part is disposed. Accordingly, an area of the sealing part 500 may be increased by a size in which the partition wall part is removed.

Therefore, an arrangement area of the sealing part 500 may be increased without increasing the thickness of the sealing part 500.

Accordingly, the sealing characteristics of the light conversion material according to the sealing part 500 may be improved.

Figure 15:
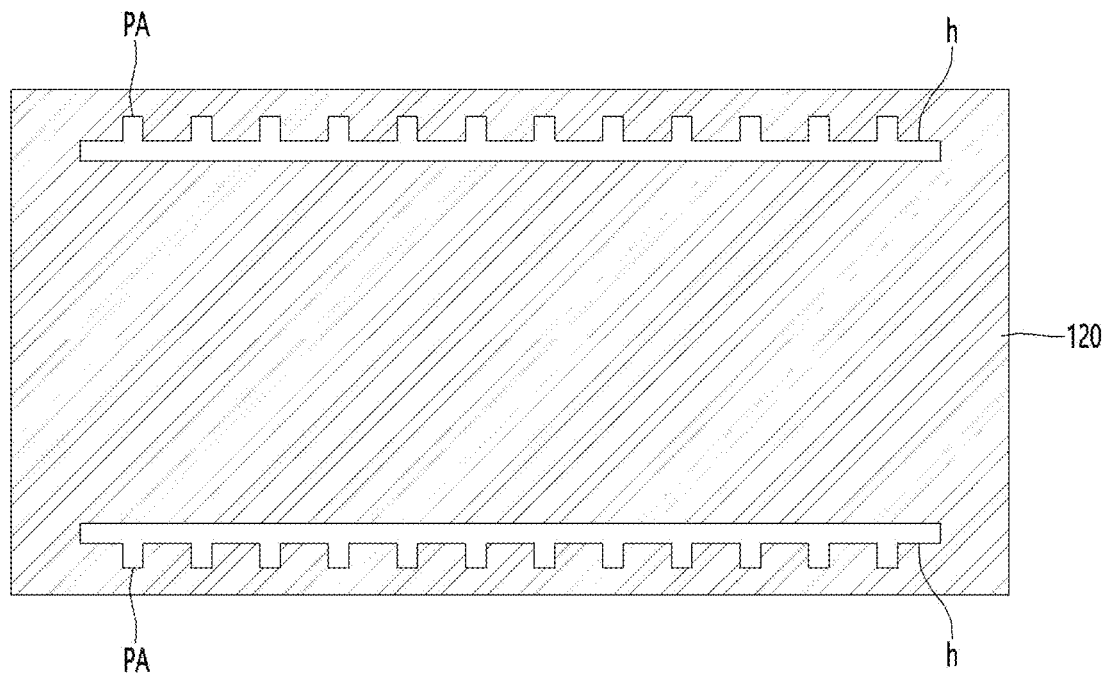
FIG. 15 is a view showing another shape of a hole formed in the second substrate.

Meanwhile, referring to FIG. 15, the hole h may include a plurality of protrusions.

In detail, the hole h may include at least one sealing protrusion PA extending in the direction of the dam part 600.

Accordingly, a specific surface area of one surface in the direction of the dam part 600 of both side surfaces of the hole h may be greater than that of the light conversion material 330.

That is, a surface roughness of one surface in the direction of the dam part 600 of the both sides of the hole h may be greater than that of the light conversion material 330.

Therefore, when the sealing material is filled in the hole h and the sealing part 500 is disposed, it is possible to induce the sealing material to diffuse in the direction of the dam part 600 rather than in the direction of the light conversion material 330.

Accordingly, it is possible to inhibit a light conversion region from reducing in the optical path control member by the movement of the sealing material in a direction of the light conversion material.

Hereinafter, referring to FIGS. 16 to 20, a display device to which an optical path control member according to an embodiment is applied will be described.

Figure 16:
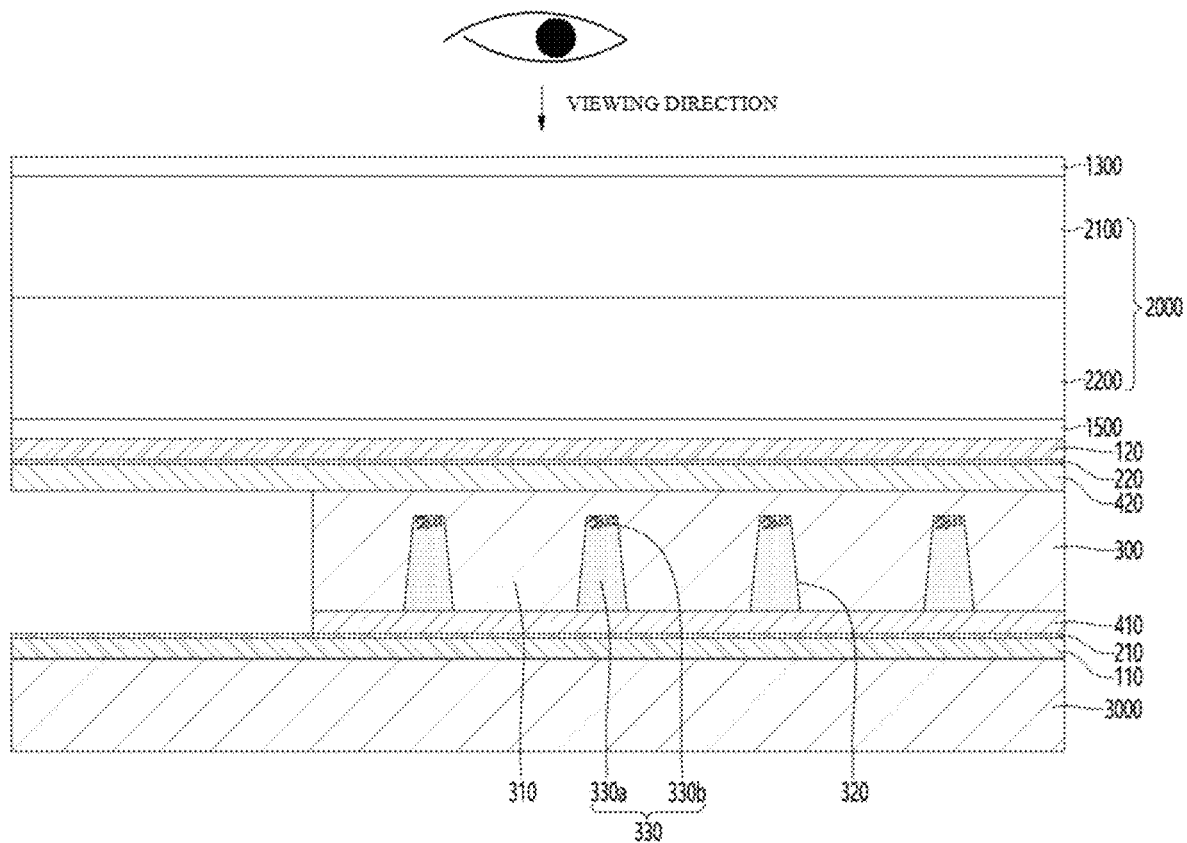
FIGS. 16 and 17 are cross-sectional views of a display device to which an optical path control member according to an embodiment is applied.
Figure 17:
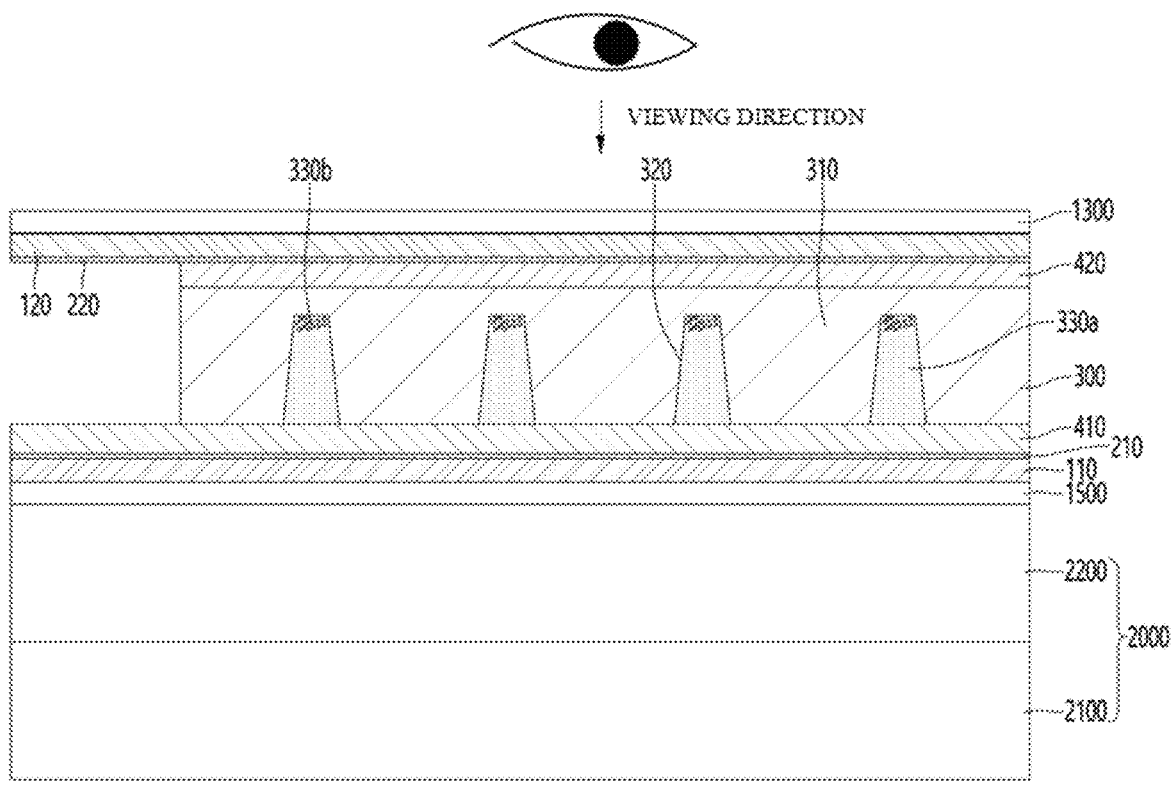

Referring to FIGS. 16 and 17, an optical path control member 1000 according to an embodiment may be disposed on or under a display panel 2000.

The display panel 2000 and the optical path control member 1000 may be disposed to be adhered to each other. For example, the display panel 2000 and the optical path control member 1000 may be adhered to each other via an adhesive layer 1500. The adhesive layer 1500 may be transparent. For example, the adhesive layer 1500 may include an adhesive or an adhesive layer including an optical transparent adhesive material.

The adhesive layer 1500 may include a release film. In detail, when adhering the optical path control member and the display panel, the optical path control member and the display panel may be adhered after the release film is removed.

The display panel 2000 may include a first' substrate 2100 and a second' substrate 2200. When the display panel 2000 is a liquid crystal display panel, the optical path control member may be formed under the liquid crystal panel. That is, when a surface viewed by the user in the liquid crystal panel is defined as an upper portion of the liquid crystal panel, the optical path control member may be disposed under the liquid crystal panel. The display panel 2000 may be formed in a structure in which the first' substrate 2100 including a thin film transistor (TFT) and a pixel electrode and the second' substrate 2200 including color filter layers are bonded to each other with a liquid crystal layer interposed therebetween.

In addition, the display panel 2000 may be a liquid crystal display panel of a color filter on transistor (COT) structure in which a thin film transistor, a color filter, and a black electrolyte are formed at the first' substrate 2100 and the second' substrate 2200 is bonded to the first' substrate 2100 with the liquid crystal layer interposed therebetween. That is, a thin film transistor may be formed on the first' substrate 2100, a protective film may be formed on the thin film transistor, and a color filter layer may be formed on the protective film. In addition, a pixel electrode in contact with the thin film transistor may be formed on the first' substrate 2100. At this point, in order to improve an aperture ratio and simplify a masking process, the black electrolyte may be omitted, and a common electrode may be formed to function as the black electrolyte.

In addition, when the display panel 2000 is the liquid crystal display panel, the display device may further include a backlight unit 3000 providing light from a rear surface of the display panel 2000.

That is, as shown in FIG. 16, the optical path control member may be disposed under the liquid crystal panel and on the backlight unit 3000, and the optical path control member may be disposed between the backlight unit 3000 and the display panel 2000.

Alternatively, as shown in FIG. 17, when the display panel 2000 is an organic light emitting diode panel, the optical path control member may be formed on the organic light emitting diode panel. That is, when the surface viewed by the user in the organic light emitting diode panel is defined as an upper portion of the organic light emitting diode panel, the optical path control member may be disposed on the organic light emitting diode panel. The display panel 2000 may include a self-luminous element that does not require a separate light source. In the display panel 2000, a thin film transistor may be formed on the first' substrate 2100, and an organic light emitting element in contact with the thin film transistor may be formed. The organic light emitting element may include an anode, a cathode, and an organic light emitting layer formed between the anode and the cathode. In addition, the second' substrate 2200 configured to function as an encapsulation substrate for encapsulation may be further included on the organic light emitting element.

In addition, although not shown in drawings, a polarizing plate may be further disposed between the optical path control member 1000 and the display panel 2000. The polarizing plate may be a linear polarizing plate or an external light reflection preventive polarizing plate. For example, when the display panel 2000 is a liquid crystal display panel, the polarizing plate may be the linear polarizing plate. Further, when the display panel 2000 is the organic light emitting diode panel, the polarizing plate may be the external light reflection inhibiting polarizing plate.

In addition, an additional functional layer 1300 such as an anti-reflection layer, an anti-glare, or the like may be further disposed on the optical path control member 1000. Specifically, the functional layer 1300 may be adhered to one surface of the first substrate 110 of the optical path control member. Although not shown in drawings, the functional layer 1300 may be adhered to the first substrate 110 of the optical path control member via an adhesive layer. In addition, a release film for protecting the functional layer may be further disposed on the functional layer 1300.

Further, a touch panel may be further disposed between the display panel and the optical path control member.

It is shown in the drawings that the optical path control member is disposed at an upper portion of the display panel, but the embodiment is not limited thereto, and the optical path control member may be disposed at various positions such as a position in which light is adjustable, that is, a lower portion of the display panel, or between a second substrate and a first substrate of the display panel, or the like.

In addition, it is shown in the drawings that the light conversion unit of the optical path control member according to the embodiment is in a direction parallel or perpendicular to an outer surface of the second substrate, but the light conversion unit is formed to be inclined at a predetermined angle from the outer surface of the second substrate. Through this, a moire phenomenon occurring between the display panel and the optical path control member may be reduced.

Figure 20:
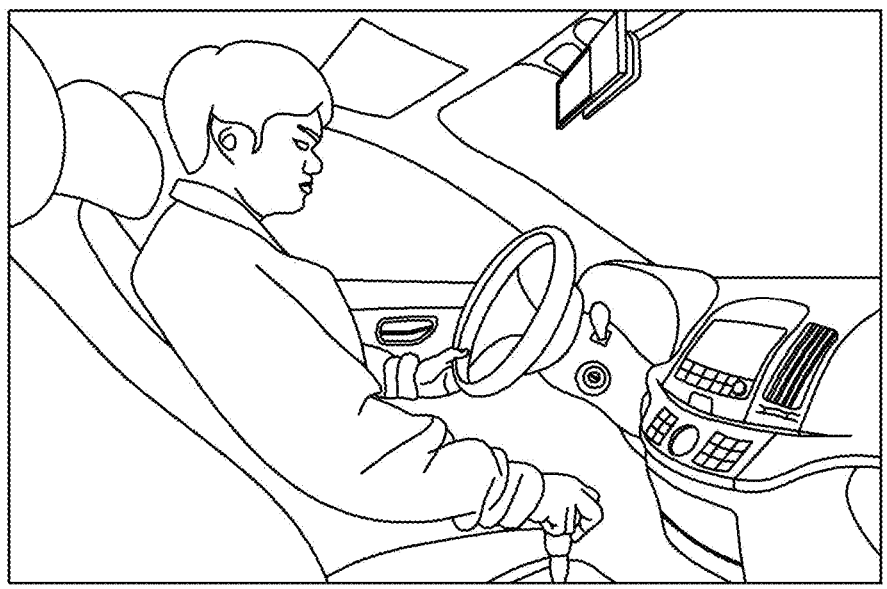

Referring to FIGS. 18 to 20, an optical path control member according to an embodiment may be applied to various display devices.

Referring to FIGS. 18 to 19, the optical path control member according to the embodiment may be applied to a display device that displays a display.

For example, when power is applied to the optical path control member as shown in FIG. 18, the accommodating part functions as the light transmitting part, so that the display device may be driven in the public mode, and when power is not applied to the optical path control member as shown in FIG. 19, the accommodating part functions as the light blocking part, so that the display device may be driven in the light blocking mode.

Accordingly, a user may easily drive the display device in a privacy mode or a normal mode according to application of power.

Light emitted from the backlight unit or the self-luminous element may move from the first substrate toward the second substrate. Alternatively, the light emitted from the backlight unit or the self-luminous element may also move from the second substrate toward the first substrate.

In addition, referring to FIG. 20, the display device to which the optical path control member according to the embodiment is applied may also be applied inside a vehicle.

For example, the display device including the optical path control member according to the embodiment may display a video confirming information of the vehicle and a movement route of the vehicle. The display device may be disposed between a driver seat and a passenger seat of the vehicle.

In addition, the optical path control member according to the embodiment may be applied to a dashboard that displays a speed, an engine, an alarm signal, and the like of the vehicle.

Further, the optical path control member according to the embodiment may be applied to a front glass (FG) of the vehicle or right and left window glasses.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, embodiments are mostly described above, but the embodiments are merely examples and do not limit the present invention, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present invention defined in the following claims.

The invention claimed is:

1. An optical path control member comprising:
   a first substrate;
   a first electrode disposed on the first substrate;
   a second substrate disposed on the first substrate;
   a second electrode disposed under the second substrate;
   a light conversion unit disposed between the first electrode and the second electrode; and
   a sealing part disposed inside at least one hole penetrating the second substrate and the second electrode,
   wherein the light conversion unit includes a plurality of accommodating parts spaced apart from each other in a first horizontal direction and a plurality of partition wall parts disposed between the plurality of accommodating parts and dividing the plurality of accommodating parts,
   wherein each of the plurality of accommodating parts extends in a second horizontal direction different from the first horizontal direction; and
   wherein the at least one hole includes a first hole and a second hole spaced apart in the second horizontal direction,
   wherein at least one of the first hole and the second hole overlaps with at least one of the plurality of accommodating parts and at least one of the plurality of partition wall parts along the second horizontal direction,
   wherein a dam part is disposed in the plurality of accommodating parts between the first hole and one end of the plurality of accommodating parts in the second horizontal direction or between the second hole and another end of the plurality of accommodating parts in the second horizontal direction.

2. The optical path control member of claim 1, comprising a buffer layer disposed between the second electrode and the light conversion unit,
   wherein the light conversion unit further includes a base part disposed between the buffer layer and the plurality of accommodating parts or the plurality of the partition wall parts, and
   wherein the hole penetrates the buffer layer, the plurality of partition wall parts, and the base part.

3. The optical path control member of claim 2, comprising an adhesive layer disposed between the first electrode and the light conversion unit,
   wherein the sealing part is disposed in direct contact with the adhesive layer.

4. The optical path control member of claim 2, wherein the sealing part includes a material different from that of the plurality of partition wall parts.

5. The optical path control member of claim 1, wherein an upper surface of the sealing part and an upper surface of the second substrate form a step.

6. The optical path control member of claim 5, wherein the upper surface of the sealing part is lower than the upper surface of the second substrate.

7. The optical path control member of claim 1,
   wherein the dam part separates a region between the first hole and the second hole of the plurality of accommodating parts from the one end and the other end of the plurality of accommodating parts,
   wherein the sealing part includes a first sealing part disposed in the first hole, and a second sealing part disposed in the second hole, and
   wherein the dam part includes a first dam part disposed between the first sealing part and the one end of the plurality of accommodating parts, and a second dam part disposed between the second sealing part and the other end of the plurality of accommodating parts.

8. The optical path control member of claim 1, wherein the first hole and the second hole extend in the first horizontal direction.

9. The optical path control member of claim 1, wherein the dam part is not disposed on the plurality of partition wall parts.

10. The optical path control member of claim 1, wherein a light conversion material, the sealing part, and the dam part are sequentially disposed while extending from a central region of the plurality of accommodating parts toward one end thereof, and wherein the light conversion material is disposed between the first hole and the second hole of the plurality of accommodating parts.

11. The optical path control member of claim 10, wherein the sealing part is disposed in contact with the light conversion material and the dam part.

12. The optical path control member of claim 11, wherein the sealing part includes a region where its width increases while extending from the second substrate toward the first substrate.

13. The optical path control member of claim 11, wherein the sealing part includes a region where its width is reduced while extending from the second substrate toward the first substrate.

14. The optical path control member of claim 11, wherein a mixing region is provided in which two materials among a sealing material of the sealing part, a dam material of the dam part, and the light conversion material are mixed.

15. The optical path control member of claim 14, wherein a first mixing region formed by mixing a sealing material and a dam material between the sealing part and the dam part and a second mixing region formed by mixing the sealing material and the light converting material between the sealing part and the light conversion material are formed inside the plurality of accommodating parts.

16. The optical path control member of claim 1, wherein at least one of the first hole and the second hole includes at least one sealing protrusion protruding toward the dam part.

17. The optical path control member of claim 1, wherein a length of at least one of the first hole and the second hole is greater than that of the plurality of accommodating parts, and a width of at least one of the first hole and the second hole is greater than that of the plurality of accommodating parts.

18. A display device comprising:

a panel including at least one of a display panel and a touch panel; and the optical path control member of claim 1, which is disposed on or under the panel.

19. The display device of claim 18, wherein the panel includes a backlight unit and a liquid crystal display panel, the optical path control member is disposed between the backlight unit and the liquid crystal display panel, and light emitted from the backlight unit moves in a direction from the first substrate towards the second substrate.

20. The display device of claim 18, wherein the panel includes an organic light emitting diode panel, the optical path control member is disposed on the organic light emitting diode panel, and light emitted from the panel moves in a direction from the first substrate towards the second substrate.

\* \* \* \* \*